United States Patent
Corzine et al.

(10) Patent No.: US 6,947,217 B2
(45) Date of Patent: Sep. 20, 2005

(54) DISTRIBUTED BRAGG REFLECTOR AND METHOD OF FABRICATION

(75) Inventors: Scott W. Corzine, Sunnyvale, CA (US); Michael Renne Ty Tan, Menlo Park, CA (US); Chao Kun Lin, Fremont, CA (US); Jintian Zhu, Palo Alto, CA (US); Michael H. Leary, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 151 days.

(21) Appl. No.: 10/022,757

(22) Filed: Dec. 14, 2001

(65) Prior Publication Data

US 2003/0112517 A1 Jun. 19, 2003

(51) Int. Cl.[7] ................................................. G02B 1/10
(52) U.S. Cl. ..................... 359/584; 359/359; 359/585
(58) Field of Search ................................. 359/585, 584, 359/359; 372/20, 94, 43, 44, 96, 45; 257/94

(56) References Cited

U.S. PATENT DOCUMENTS

| | | | | |
|---|---|---|---|---|
| 5,303,255 A | * | 4/1994 | Kudo et al. ................... | 372/96 |
| 6,150,190 A | * | 11/2000 | Stankus et al. ............... | 438/72 |
| 6,233,267 B1 | * | 5/2001 | Nurmikko et al. ............ | 372/46 |
| 6,306,672 B1 | | 10/2001 | Kim | |
| 6,324,192 B1 | * | 11/2001 | Tayebati ...................... | 372/20 |
| 6,326,646 B1 | * | 12/2001 | Baillargeon et al. .......... | 257/94 |

FOREIGN PATENT DOCUMENTS

| | | |
|---|---|---|
| JP | 11307863 | 11/1999 |
| JP | 2111353858 | 12/2000 |

OTHER PUBLICATIONS

Article from the 13th European Conference on Solid–State Transducers, Sep. 12–15, pp. 519–522, entitled Tunable Fabry–Perot filter as an Application of a Micro Opto Electro Mecanical System Based on III–V Semiconductor Material.
Article from the 11th International Conference on Indium Phosphide and Related Materials, May 16–20, 1999, pp. 285–287, entitled Tunable INP/AIR Gap Fabry Perot Filter for Wavelength Division Multiplex Fiber Optical Transmission.
Article from Electronic Letters, Jul. 18th, 1996, vol. 32, No. 15, pp. 1369–1370, entitled 1.26micrometer vertical cavity laser with two InP/air–gap reflectors by K. Streubel, S. Rapp, J. Andre and N. Chitica.
Streubel, K. et al., "1.26um Vertical Cavity Laser with Two InP/Air–Gap Reflectors", Electronics Letters, Jul. 18, 1996, vol. 32, No. 15, pp. 1369–1370.
Sang–Tiong Ho, et al., "High Index Contrast Mirrors for Optical Microcavities", Applied Physics Letters, Oct. 1, 1990, No. 14, pp. 1387–1389.

* cited by examiner

*Primary Examiner*—Drew A. Dunn
*Assistant Examiner*—Joshua L Pritchett

(57) ABSTRACT

A distributed Bragg reflector and a method of fabricating the same incorporates a support for supporting the gaps against collapse. The method includes forming a plurality of alternating structure and sacrificial layers on a substrate. The structure and sacrificial layers are etched into at least one mesa protruding from the substrate. A support layer is formed on the at least one mesa leaving a portion of the structure and sacrificial layers exposed. At least a portion of at least one of the exposed sacrificial layers are etched from between the structure layers to form gaps between the structure layers.

12 Claims, 3 Drawing Sheets

DISTRIBUTED BRAGG REFLECTOR AND METHOD OF FABRICATION

BACKGROUND OF THE INVENTION

1. Technical Field of the Invention

The present invention relates in general to optical devices, and more particularly to distributed Bragg reflectors and their fabrication.

2. Description of Related Art

A distributed Bragg reflector (DBR) is a periodic grating that, in a semiconductor system, can be monolithically formed on a wafer from alternating layers of differing index of refraction. DBRs have applications in various optic devices, in part because DBRs can achieve a high reflectivity in a relatively compact space. Further, DBRs can be tested immediately after fabrication on a wafer, unlike a crystalline reflector that must be cleaved prior to testing. Examples of devices that have incorporated DBRs include tunable optic filters, tunable detectors, and surface emitting lasers including vertical cavity surface emitting lasers (VCSEL).

The reflectivity of a DBR is a function of both its geometry and the relative difference between the index of refraction of the layers. The relative difference in the index of refraction of two materials is referred to as the index contrast. Generally, the reflectivity increases as the index contrast between layers increases and as the number of layers of the DBR increases. Also, the stop band width of the DBR increases as the index contrast increases.

A DBR can be formed from layers of semiconductor or dielectric materials layered together using known semiconductor fabrication techniques. For example, indium gallium arsenide phosphide (InGaAsP) can be layered together with indium phosphide (InP) (InGaAsP/InP DBR). Because the index of contrast between InGaAsP and InP is relatively small, on the order of 0.18, the number of layers needed to achieve a given reflectivity is high. Also, the stop band width is relatively small. In another example, silicon dioxide ($SiO_2$) and titanium dioxide ($TiO_2$) can be layered together ($SiO_2/TiO_2$ DBR). $SiO_2$ and $TiO_2$ have a high index of contrast, on the order of 0.77, so relatively fewer layers are needed to achieve the same reflectivity. In comparison to a InGaAsP/InP DBR, a $SiO_2/TiO_2$ DBR can be more compact while achieving the same reflectivity. This combination also has a broader stopband width than an InGaAsP and InP DBR.

In a final example, an air/semiconductor DBR can be formed where layers of a semiconductor material, such as InP, are spaced apart by air gaps. Air and InP have a high index contrast of 2.2. An air/semiconductor DBR can achieve a high reflectivity with a relatively small number of layers over a broad stopband width because the index contrast between most semiconductor materials and air is large. In comparison with a InGaAsP/InP DBR or a $SiO_2/TiO_2$ DBR, the air/semiconductor DBR can be the most compact at a given reflectivity.

Air/semiconductor DBRs are fabricated by growing or depositing two different epitaxial films onto a substrate. The film materials are chosen to have a high etch selectivity, allowing one film to be substantially etched while leaving the other substantially intact. The film layers are masked and etched into one or more mesa formations. A DBR will be constructed from each mesa. A selective etch is used to remove or undercut portions of one material, thus creating air gaps between cantilevered layers of remaining material.

Constructing an air/semiconductor DBR is a difficult process, because the air gaps are unstable and can easily collapse both during and after the fabrication process. Residual stresses in the remaining material, resulting from the growth or deposition process, can cause the remaining material to collapse and close off the air gaps. Thus, prior art DBR fabrication techniques have sought to carefully control the film deposition or growth procedure to minimize the residual stresses. Also, when the etchant is rinsed from the air gaps, the surface tension of the fluid rinse leaving the air gaps tends to pull the remaining material together and collapse the air gaps. Prior art DBR fabrication techniques have tried to overcome this difficulty by utilizing fluid rinses with low surface tension to minimize the tendency of the air gaps to collapse. Other prior art DBR fabrication techniques have used critical point freeze drying or sublimation drying, where the rinse is sublimated or quickly evaporated by dropping the ambient pressure or temperature, to prevent the surface tension of the rinse from collapsing the air gaps. These methods have been mostly effective, but there still exists a possibility that the air gaps will collapse.

Thus, there is a need for an improved air/semiconductor distributed Bragg reflector and method of fabricating the same that better prevents collapse of the air gaps.

SUMMARY OF THE INVENTION

The present application is drawn to an improved air/semiconductor Bragg reflector and a method for fabricating the same that incorporates a support layer for supporting the gaps against collapse.

The method includes forming a plurality of alternating DBR structure and sacrificial layers on a substrate. The structure and sacrificial layers are etched into at least one mesa protruding from the substrate. A support layer is formed on the at least one mesa leaving a portion of the structure and sacrificial layers exposed. A portion of at least one of the exposed sacrificial layers is etched from between the structure layers to form gap between the structure layers.

An exemplary Bragg reflector in accordance with the invention includes one or more first layers interstitially spaced between a two or more second layers. The layers have at least one sidewall. The first layers are undercut to define gaps between the second layers. A support layer is formed over at least a portion of the sidewalls to support the second layers.

An exemplary Bragg reflector in accordance with the invention includes a substrate with a plurality of structure layers on the substrate each spaced apart by a gap. The structure layers each have edges. A support layer is provided about a portion of the edges for supporting the structure layers in substantially parallel relation.

The support layers of the present invention provide support to the structure layers and prevent their collapse into the gaps. Therefore, the air/semiconductor structure is more robust, and does not require use of special rinse techniques. Furthermore, the invention provides embodiments with other features and advantages in addition to or in lieu of those discussed above. Many of these features and advantages are apparent from the description below with reference to the following drawings.

BRIEF DESCRIPTION OF THE DRAWINGS

Various objects and advantages of the invention will become apparent and more readily appreciated from the following description of the presently preferred exemplary embodiments, taken in conjunction with the accompanying drawings of which.

DETAILED DESCRIPTION OF EXEMPLARY EMBODIMENTS OF THE INVENTION

Exemplary embodiments of the invention will now be described more fully with reference to the accompanying drawings. This invention may, however, be embodied in many different forms and should not be construed as limited to the embodiments and preferred methods set forth herein.

Figure 1A:
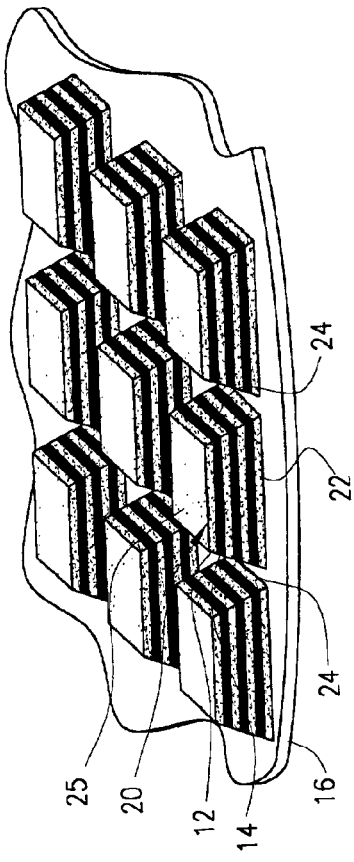
FIGS. 1A–1D are schematic perspective views depicting different stages in the fabrication of an exemplary distributed Bragg reflector in accordance with the invention.

FIGS. 1A–1D depict stages in the fabrication of an exemplary distributed Bragg reflector 10 in accordance with this invention. Referring first to FIG. 1A, the Bragg reflector 10 is formed by growing or depositing alternating structure layers 12 and sacrificial layers 14 onto a substrate 16. The outermost layer is preferably a structure layer 12, and the number of layers will depend on the reflectivity and stop band required of the Bragg reflector 10. For example, the layers 12 could comprise as little as one sacrificial layer 14 and one structure layer 12 if the required reflectivity was low. The layers 12, 14 are preferably substantially parallel to each other. The thickness of the layers 12, 14 are preferably in multiples of a quarter wavelength of a wavelength of light for which the Bragg reflector 10 is optimized.

Figure 3:
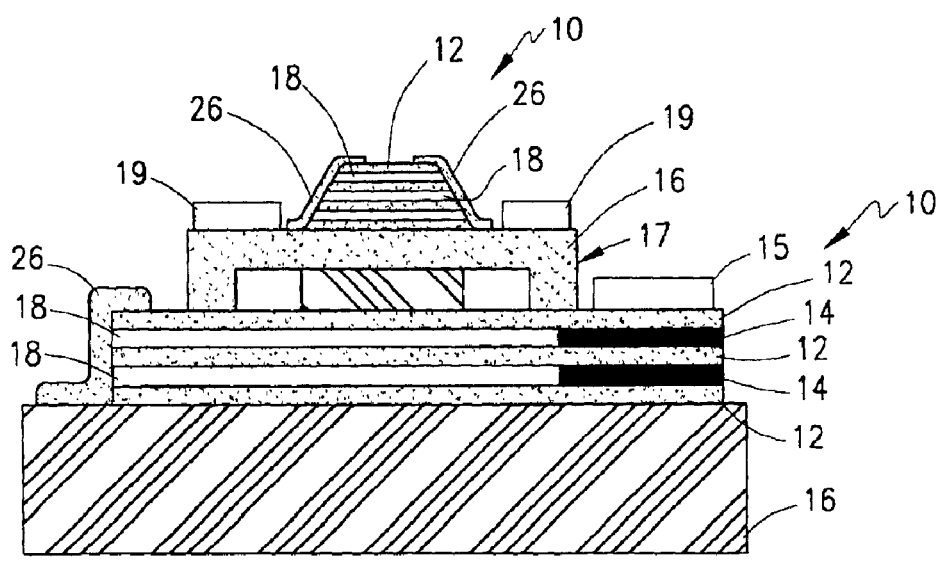
FIG. 3 is a schematic of an exemplary vertical cavity surface emitting laser using Bragg reflectors constructed in accordance with the invention.

It is important to note that the term "substrate" is used to broadly include virtually any surface upon which the Bragg reflector 10 can be formed. For example, in the construction of a VCSEL (see FIG. 3), a first Bragg reflector 10 can be formed on a wafer 16 having an n-contact 15. The VCSEL's active region 17 can then be formed on top of the first Bragg reflector 10 and a second Bragg reflector 10 formed on top of the active region 17. Finally, a p-contact 19 is formed on top of the second Bragg reflector 10. In the VCSEL configuration, the active region 17 is the same as the substrate 16.

The materials of the structure layer 12 and the sacrificial layers 14 are preferably chosen to have a high etch selectivity, because at least a portion of each sacrificial layer 14 will later be etched from between the structure layers 12 to define gaps 18 (see FIG 1D). An example of a preferred combination of materials for structure layers 12 and sacrificial layers 14 is indium phosphide (InP) as the structure layers 12 and indium gallium arsenide (InGaAs) as the sacrificial layers 14. InGaAs can be substantially etched with ferric chloride and water ($FeCl_3$:$H_2O$), while leaving InP substantially unetched. One of ordinary skill in the art will appreciate that other combinations of materials for the structure layers 12 and sacrificial layers 14 can be substituted, for example, but in no means by limitation, gallium arsenide (GaAs) as the structure layers 12 and aluminum arsenide (AlAs) as the sacrificial layers 14 or silicon (Si) as the structure layers 12 and silicon dioxide ($SiO_2$) as the sacrificial layers 14.

It is preferable to produce more than one Bragg reflector 10 at a time, because this reduces the cost to manufacture each Bragg reflector 10 by allowing the use of batch processing techniques. Thus, structure layers 12 and sacrificial layers 14 are preferably applied substantially uniformly across a portion of wafer 16 over an area large enough to produce more than one Bragg reflector 10. However, one of ordinary skill in the art will readily appreciate that the structure layers 12 and sacrificial layers 14 need only be applied over enough area to fabricate a single Bragg reflector 10. Therefore, the invention encompasses the application of the methods described herein to both batch processing and individual fabrication of Bragg reflectors 10.

Figure 1B:
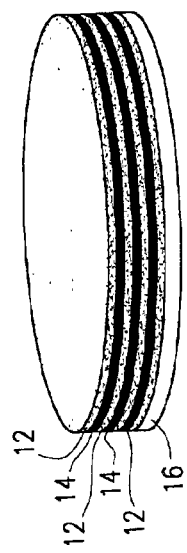
Figure 4A:
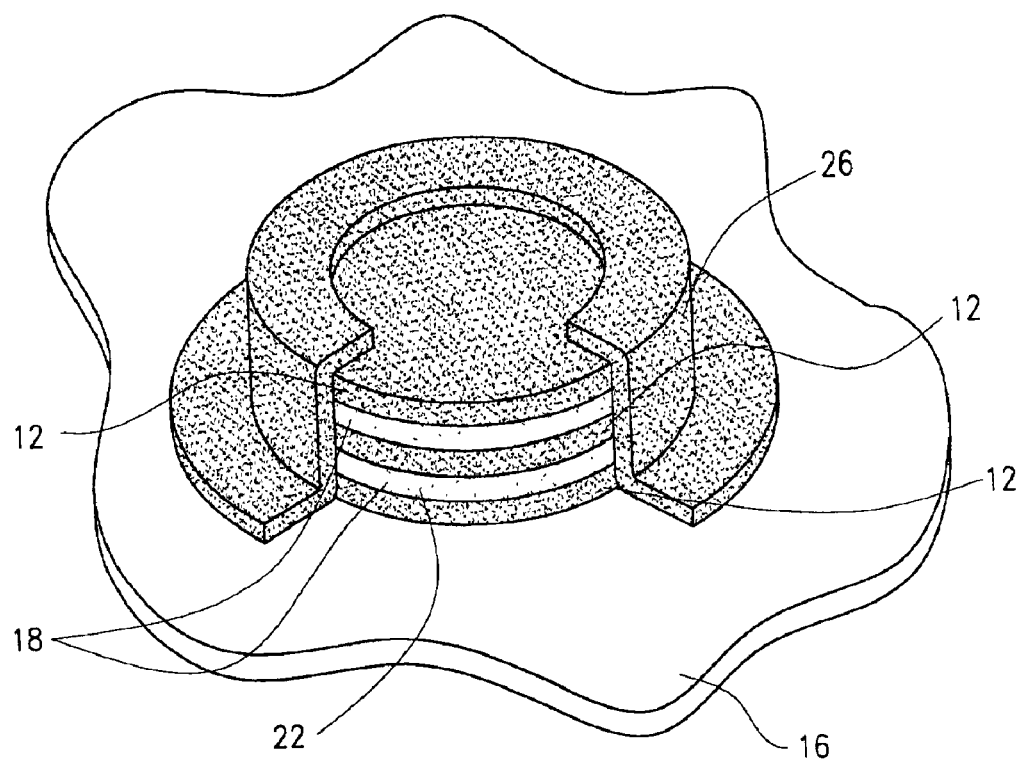
FIGS. 4A and B are schematic perspective view depicting alternate configurations of exemplary distributed Bragg reflectors in accordance with the invention.

Referring to FIG. 1B, a non-selective etch, either wet or dry, can be used to etch away portions of the structure and sacrificial layers 12, 14 and expose the ends thereof. Preferably, the layers 12, 14 are etched to form one or more mesas 20 that protrude from the surface of the substrate 16. The mesas 20 are regions of structure and sacrificial layers 12, 14 that define the general shape of the reflector 10. The mesas 20 do not need to be rectangular as is depicted in the figures, but can be virtually any shape, for example, cylindrical (see FIG. 4A). If a single Bragg reflector 10 is being fabricated, a single mesa 20 is etched. If multiple Bragg reflectors 10 are being fabricated, one mesa 20 for each Bragg reflector 10 is etched.

The mesas 20 can be etched using known masking and patterning techniques. For example, a photoresist can be applied over the outermost layer, preferably a structure layer 12. The photoresist is patterned to mask the layers 12 such that the etching will form the one or more mesas 20. Afterwards, the photoresist is removed. For convenience of reference, each completed mesa 20 is said to have a front face 22 and a sidewall (if the mesa 20 is cylindrical) or sidewalls 24.

Figure 1C:
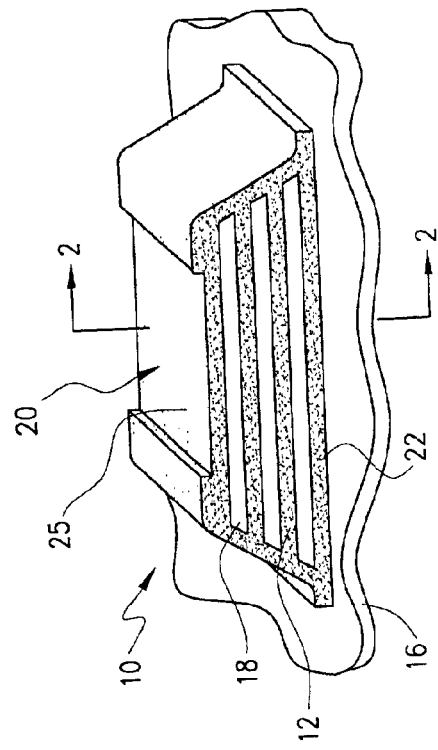
Figure 4B:
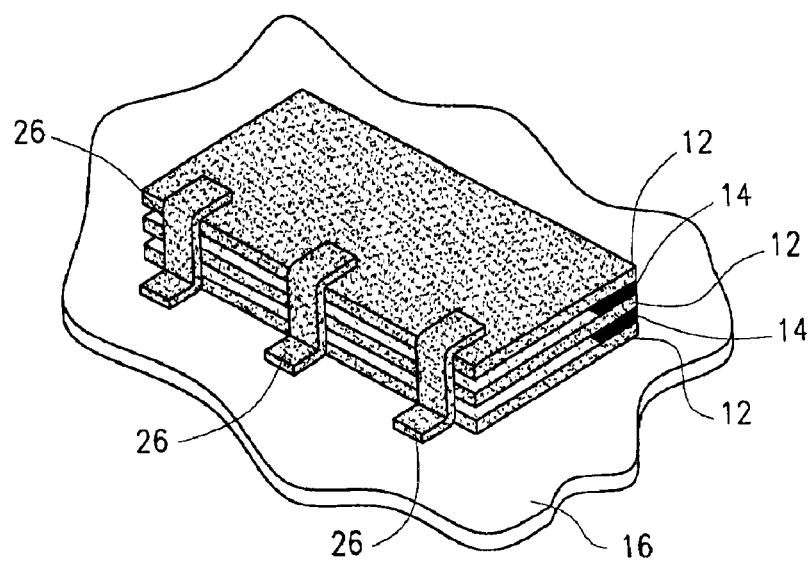

Referring to FIG. 1C, an additional support layer 26 is grown or deposited on a portion of the sidewalls 24, and preferably overlapping a portion of the top 25 of the mesa 20. The front face 22 is left open to allow access to etch the sacrificial layers 14. Also, the support layer 26 need not be continuous across the sidewalls 24 (for example FIG. 4B). Known masking and patterning techniques can be used to mask the front face 22 and prevent growth or deposition of the support layer 26 on masked portions. For example, if the support layer 26 is deposited in a chemical vapor deposition (CVD) process, a dielectric mask will allow deposition only in the unmasked regions of the mesa 20. Because the sacrificial layers 14 must be etched without substantially etching the support layer 26, a convenient material for the support layer 26 can be the material of the structure layer 12. Thus, in the example above, where the structure layer 12 was InP, the support layer 26 could also be InP. However, other materials with a high etch selectivity relative to the sacrificial layers 14 can be used. When depositing an InP support layer 26, a metal organic CVD (MOCVD) deposition process is preferred.

Figure 1D:
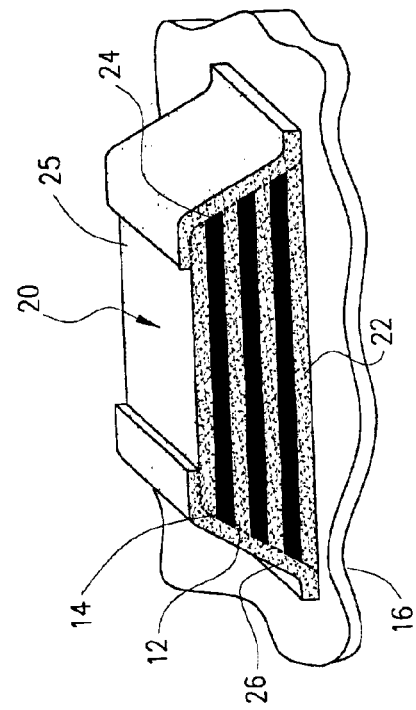
Figure 2:
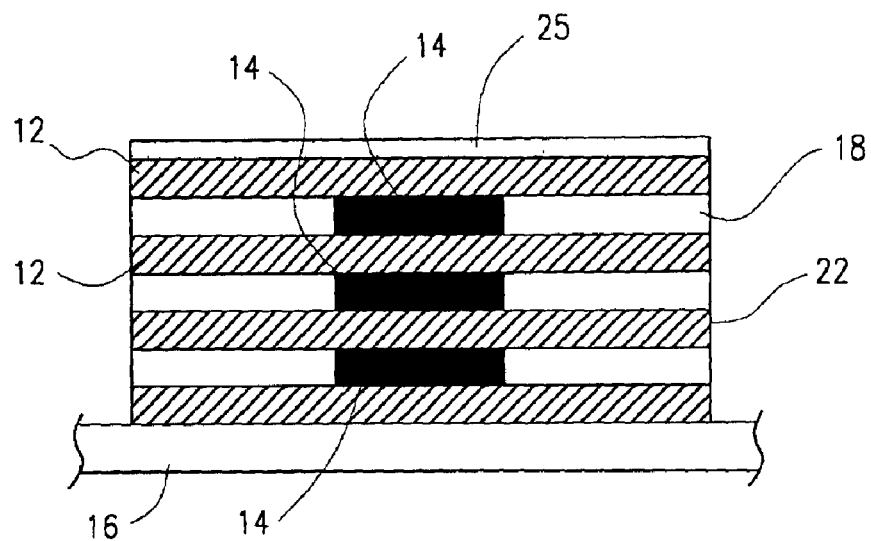
FIG. 2 is a schematic side sectional view taken along 2—2 of FIG. 1D.

Referring now to FIG. 1D, the sacrificial layers 14 are etched with a selective etch to form gaps 18. The etch is selected to leave the structure layers 12 and the support layer 26 substantially unetched. As noted above, $FeCl_3$:$H_2O$ is preferred with InP structure and InGaAs sacrificial layers. As can be seen from FIG. 2, only enough of the sacrificial layers 14 required to form the gaps 18 need be etched, and the remainder will act to space the structure layers 12 apart. As can be seen from FIG. 4B, etching the sacrificial layers 14 to leave a portion of the sacrificial layers 14 along a side of the Bragg reflector 10 can support that side. The supported side would not need support layer 26.

Referring again to FIG. 1D, the support layer 26 remains around the sidewalls 24 and functions to provide additional support to the structure layers 12. The additional support helps counteract the tendency of the structure layers 12 to collapse, and thus supports the structure layers 12 in substantially parallel relation. The additional support of the support layer 16 also helps to reinforce the structure layers 12 against the surface tension of the fluid rinse.

Any part of the support layer 26 can be doped to create a conductive or semi-conductive path to funnel or constrict electrical current through the Bragg reflector 10. Alternatively, doping can produce semi-insulating or non-conducting areas. For example, portions of an InP support layer 26 doped with iron (Fe) will be semi-insulating. The support layer 26 can also act as a thermal pathway to extract heat out of a device. For example, in a VCSEL utilizing the Bragg reflector 10 (see FIG. 3), the support layer 26 acts to conductively cool the active region 17.

The exemplary embodiments have several significant advantages. The support layers support the structure layers making them less susceptible to collapse from internal stress or the surface tension of the fluid rinse. Thus, there is no need for low surface tension rinses nor is there a need to critical point freeze dry the DBRs to prevent the layers from collapsing. Also, the resultant air/semiconductor DBRs can be more compact than other air/semiconductor DBRs, because the support layers support the gaps in a more space efficient fashion.

It is to be understood that while the invention has been described above in conjunction with a few exemplary embodiments, the description and examples are intended to illustrate and not limit the scope of the invention. That which is described herein with respect to the exemplary embodiments can be applied to the construction of many different configurations of Bragg reflectors. Thus, the scope of the invention should only be limited by the following claims.

We claim:

1. A Bragg reflector comprising:
   one or more first layers adjacent one or more second layers, the first and second layers having at least one sidewall, wherein the first and second layers define one or more gaps; and
   a support layer formed over a portion of the sidewalls to support the second layers against movement, said support layer partially overlays a top side of a top layer of said one or more second layers.

2. The Bragg reflector of claim 1 wherein the second layers and the support layer comprise substantially the same material.

3. The Bragg reflector of claim 1 wherein at least a portion of the support layer is electrically conductive.

4. The Bragg reflector of claim 1 wherein a portion of the support layer is electrically non-conductive.

5. The Bragg reflector of claim 1, wherein the support layer holds said second layers substantially parallel to each other.

6. A distributed Bragg reflector comprising:
   a substrate;
   a plurality of structure layers on the substrate each spaced apart by a gap, the structure layers each having edges; and
   a support layer about a portion of the edges for supporting the structure layers such that the structure layers remain stationary, said support layer patially overlaps a top side of a top structure layer.

7. The distributed Bragg reflector of claim 6 further comprising sacrificial layers between the structure layers, the sacrificial layers undercut to define the gaps.

8. The distributed Bragg reflector of claim 6 wherein the support layer comprises a material selected from the group consisting of InP, GaAs, and Si.

9. The distributed Bragg reflector of claim 6 wherein the structure layers comprise a material selected from the group consisting of InP, GaAs, and Si.

10. The distributed Bragg reflector of claim 6 wherein the support layer covers at least a portion of a top of the structure layers.

11. The distributed Bragg reflector of claim 6, wherein the support layer further holds said plurality of structure layers substantially parallel to each other.

12. A distributed Brag reflector comprising:
    a substrate;
    a plurality of structure layers on top of the substrate each spaced apart by a gap, the structure layers each having edges; and
    a support layer being about a portion of the edges and overlapping a top portion of a top structure layer.

* * * * *